United States Patent
Yi

(10) Patent No.: US 9,588,392 B2
(45) Date of Patent: Mar. 7, 2017

(54) THIN-FILM TRANSISTOR

(71) Applicant: Shenzhen China Star Optoelectronics Technology Co., Ltd., Shenzhen, Guangdong (CN)

(72) Inventor: Zhiguang Yi, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 170 days.

(21) Appl. No.: 14/411,065

(22) PCT Filed: Oct. 24, 2014

(86) PCT No.: PCT/CN2014/089425
§ 371 (c)(1),
(2) Date: Dec. 23, 2014

(87) PCT Pub. No.: WO2016/061808
PCT Pub. Date: Apr. 28, 2016

(65) Prior Publication Data
US 2016/0282649 A1    Sep. 29, 2016

(30) Foreign Application Priority Data

Oct. 20, 2014 (CN) .......................... 2014 1 0558127

(51) Int. Cl.
| H01L 27/14 | (2006.01) |
| G02F 1/1368 | (2006.01) |
| H01L 29/786 | (2006.01) |
| H01L 29/08 | (2006.01) |

(52) U.S. Cl.
CPC ............ *G02F 1/1368* (2013.01); *H01L 29/08* (2013.01); *H01L 29/786* (2013.01); *H01L 29/78696* (2013.01)

(58) Field of Classification Search
CPC ............... H01L 21/3105; H01L 29/786; H01L 29/78696; H01L 29/08; G02F 1/1368
USPC .............................................. 257/72, 66, 57
See application file for complete search history.

(56) References Cited

U.S. PATENT DOCUMENTS

| 2006/0038174 A1* | 2/2006 | Maekawa | ............... H01L 27/12 257/57 |
| 2008/0157086 A1* | 7/2008 | Liu | ..................... H01L 27/1214 257/59 |
| 2009/0061573 A1* | 3/2009 | Miyairi | ................... H01L 29/04 438/160 |

(Continued)

*Primary Examiner* — Vongsavanh Sengdara
(74) *Attorney, Agent, or Firm* — Andrew C. Cheng

(57) ABSTRACT

Disclosed is a thin-film transistor, which includes a gate terminal, a source terminal, and a drain terminal. The source terminal and the drain terminal are arranged side-by-aide above the gate terminal. The source terminal includes a first edge. The drain terminal includes a second edge. The first edge and the second edge face each other. The first edge and the second edge form therebetween a channel. The first edge and the second edge are both in a nonlinear form. A dimension of the channel in an extension of the first edge and the second edge is a width of the channel. The channel is narrowed from a middle thereof toward two ends in the widthwise direction of the channel. Light transmittance in each portion of the channel of the thin-film transistor is made consistent and the quality of the thin-film transistor is enhanced.

12 Claims, 4 Drawing Sheets

(56) References Cited

U.S. PATENT DOCUMENTS

| | | | | |
|---|---|---|---|---|
| 2009/0137103 A1* | 5/2009 | Yamazaki | ......... | H01L 21/67161 |
| | | | | 438/479 |
| 2009/0152550 A1* | 6/2009 | Ohnuma | ............ | H01L 21/3105 |
| | | | | 257/57 |
| 2010/0062556 A1* | 3/2010 | Sasagawa | ........... | H01L 27/1214 |
| | | | | 438/34 |
| 2010/0099226 A1* | 4/2010 | Sasagawa | ........... | H01L 27/1214 |
| | | | | 438/158 |
| 2014/0253858 A1* | 9/2014 | Kawano | ........... | G02F 1/134336 |
| | | | | 349/143 |

* cited by examiner

THIN-FILM TRANSISTOR

CROSS REFERENCE TO RELATED APPLICATIONS

This application claims the priority of Chinese Patent Application No. 201410558127.5 filed on Oct. 20, 2014, the disclosure of which is incorporated herein by reference in its entirety.

BACKGROUND OF THE INVENTION

1. Field of the Invention

The present invention relates to a thin-film transistor device of a liquid crystal display.

2. The Related Arts

In a currently available design of a thin-film transistor used in a large-sized thin-film transistor liquid crystal display (TFT-LCD) where a source terminal and a drain terminal are arranged to be parallel to and in alignment with each other, the thin-film transistor comprises a gate terminal (not shown), a source terminal 20, and a drain terminal 40. Referring to FIG. 1, the source terminal 20 and the drain terminal 40 are arranged side by side and above the gate terminal and edges of the source terminal 20 and the drain terminal 40 that oppose each other are parallel to each other. In other words, a straight channel 60 is formed between the source terminal 20 and the drain terminal 40. A channel 60 formed between the source terminal 20 and the drain terminal 40 is a semipermeable film structure. The areas of the source terminal 20 and the drain terminal 40 are completely non-light-transmitting, while the channel 60 is partly light transmitting. The channel 60 comprises a channel width W and a channel length L. Irradiation of light is made on opposite sides of the channel. Since the light receiving areas at the two ends of the channel are greater than the middle, after exposure, photoresist at the two ends are removed and a curved configuration is formed, as shown in FIG. 2. Under this condition, the channel width W of the channel 60 is reduced and charging rate of the thin-film transistor is affected. At the worst, the channel 60 may be broken through, namely the channel width W becomes zero. This becomes open-circuiting, totally ruin the thin-film transistor.

SUMMARY OF THE INVENTION

The technical issue to be addressed by the present invention is to provide a thin-film transistor, which improves the situation of channel width reducing during an exposure process so as to ensure the charging rate of the thin-film transistor and enhance the quality thereof.

To achieve the above object, the present invention provides a technical solution as follows.

The present invention provides a thin-film transistor, which comprises a gate terminal, a source terminal, and a drain terminal. The source terminal and the drain terminal are arranged in a side-by-side manner above the gate terminal. The source terminal comprises a first edge. The drain terminal comprises a second edge. The first edge and the second edge face each other. The first edge and the second edge form therebetween a channel. The first edge and the second edge are both in a nonlinear form. A dimension of the channel in an extension direction of the first edge and the second edge is a width of the channel and the channel is narrowed from a middle thereof toward two ends in the widthwise direction of the channel.

The first edge comprises a first segment, a second segment, and a third segment that are connected in sequence. The first segment and the third segment are arranged in a symmetric manner at opposite ends of the second segment. The first segment comprises a connection end connected to the second segment and a free end distant from the second segment and the first segment is arranged to get closer to the second edge in a direction from the connection end to the free end.

The second edge and the first edge are of the same configuration.

The second segment is linear.

The first segment and the third segment are both in a linear form and an included angle between the first segment and the second segment and an included angle between the third segment and the second segment are obtuse angles.

The first segment and the third segment are both in a curved form and smooth transitions are respectively formed between the first segment and the second segment and between the third segment and the second segment.

A channel length in the middle of the channel is 4.5 um and a channel length at the ends of the channel is greater than 2.5 um and smaller than 4.5 um.

The present invention makes modification on the opposing edges of the source terminal and the drain terminal, namely making both the first edge and the second edge in a nonlinear form, in such a way that in the widthwise direction of the channel, the channel is narrowed from the middle thereof toward the two ends. During a process of exposure, the two-end-narrowed configuration of the channel allows the optical energy received at the two ends of the channel of the thin-film transistor to correspond to the optical energy received at the middle. In other words, light transmittance at each portion of the channel of the thin-film transistor is made consistent and thus the quality of the thin-film transistor is enhanced.

BRIEF DESCRIPTION OF THE DRAWINGS

To more clearly explain the technical solution proposed in the present invention, a brief description of the drawings that are necessary for embodiments is given as follows. It is obvious that the drawings that will be described below show only some embodiments. For those having ordinary skills of the art, other drawings may also be readily available from these attached drawings without the expense of creative effort and endeavor.

DETAILED DESCRIPTION OF THE PREFERRED EMBODIMENTS

A clear and complete description will be given to a technical solution of an embodiment of the present invention with reference to the attached drawings of the embodiment of the present invention.

Figure 1:
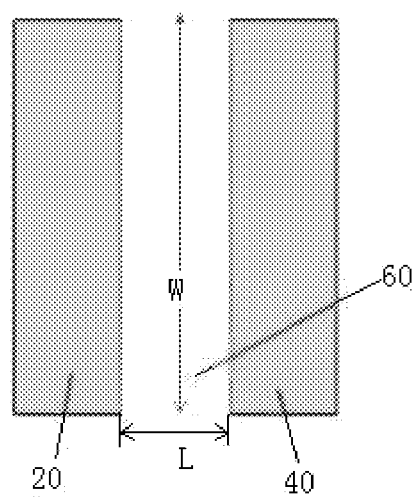
FIG. 1 is a schematic view illustrating a source terminal and a drain terminal of a prior art thin-film transistor.
Figure 2:
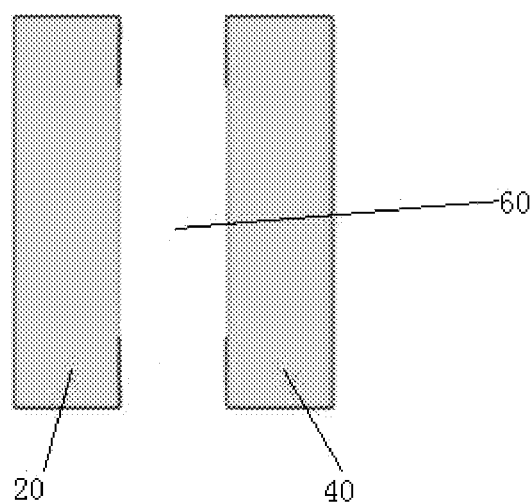
FIG. 2 is a schematic view illustrating the prior art thin-film transistor of FIG. 1 after exposure.
Figure 3:
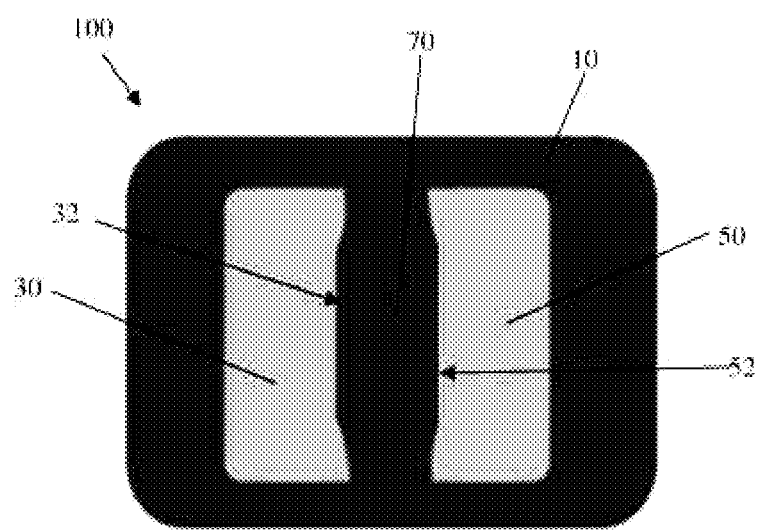
FIG. 3 is a schematic view illustrating a thin-film transistor according to an embodiment of the present invention.
Figure 4:
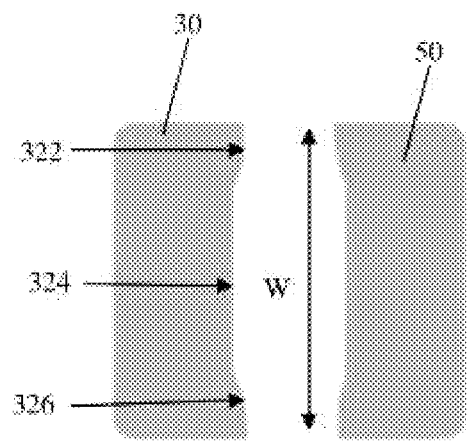
FIG. 4 is another schematic view illustrating a thin-film transistor according to an embodiment of the present invention.

Referring to FIGS. 3 and 4, the present invention provides a thin-film transistor 100, which comprises a gate terminal 10, a source terminal 30, and a drain terminal 50. The source terminal 30 and the drain terminal 50 are arranged, in a side-by-side manner, above the gate terminal 10. In the instant embodiment, the gate terminal 10 is formed on a substrate (not shown). The substrate is a glass substrate and may alternatively be made of other materials and may be a flexible substrate or a non-flexible substrate. The gate terminal 10 is made of a material that comprises for example molybdenum (Mo) or aluminum (Al) or a material of other metals or metal compounds or a multilayered combination.

The source terminal 30 comprises a first edge 32 and the drain terminal 50 comprises a second edge 52. The first edge 32 and the second edge 52 are arranged to face each other. The first edge 32 and the second edge 52 collectively form therebetween a channel 70. The first edge 32 and the second edge 52 are both in a nonlinear form. A dimension of the channel 70 in an extension direction of the first edge 32 and the second edge 52 is referred to as a width of the channel 70, which is the dimension designated with reference character W in FIG. 3. In the widthwise direction of the channel 70, the channel 70 is narrowed down from a middle thereof towards two ends.

The present invention makes modification on the opposing edges of the source terminal 30 and the drain terminal 50 (namely the first edge 32 and the second edge 52), namely making both the first edge 32 and the second edge 52 in a nonlinear form, in such a way that in the widthwise direction of the channel 70, the channel 70 is narrowed from the middle thereof toward the two ends. During a process of exposure, the two-end-narrowed configuration of the channel 70 allows the optical energy received at the two ends of the channel 70 of the thin-film transistor to correspond to the optical energy received at the middle. In other words, light transmittance at each portion of the channel 70 of the thin-film transistor is made consistent and thus the quality of the thin-film transistor is enhanced.

The first edge 32 and the second edge 52 are both of a nonlinear arrangement. In a specific embodiment, the first edge 32 and the second edge 52 can be each arranged as a combination of multiple line segments or the first edge 32 and the second edge 52 can be arranged in a curved form, or the first edge 32 and the second edge 52 can be arranged as a combination of linear segments and curved segments. The present invention does not impose limitations to the specific configurations of the first edge 32 and the second edge 52 and what is necessary is that the first edge 32 and the second edge 52 are both in a nonlinear form and the channel 70 is narrowed from the middle thereof toward the two ends in order to achieve consistence of light transmittance in all portions of the channel 70 of the thin-film transistor and thus enhance the quality of the thin-film transistor.

Specifically, as shown in FIG. 4, the first edge 32 comprises a first segment 322, a second segment 324, and a third segment 326 that are connected in sequence. The first segment 322 and the third segment 326 are arranged in a symmetric manner at opposite ends of the second segment 324. The first segment 322 comprises a connection end connected to the second segment 324 and a free end distant from the second segment 324. The first segment 322 is getting closer to the second edge 52 in a direction from the connection end to the free end. In other words, at the free end, the first edge 32 is spaced from the second edge 52 by a smallest distance.

In the instant embodiment, the second edge 52 and the first edge 32 are of the same configuration. The second edge 52 and the first edge 32 are arranged, in a symmetric manner, at opposite sides of the channel 70.

In the instant embodiment, the second segment 324 in linear.

In an embodiment, the first segment 322 and the third segment 326 are both linear and an included angle between the first segment 322 and the second segment 324 and an included angle between the third segment 326 and the second segment 324 are both obtuse angles.

In another embodiment, the first segment 322 and the third segment 326 are both curved and smooth transitions are respectively formed between the first segment 322 and the second segment 324 and between the third segment 326 and the second segment 324.

Specifically, the length of the channel 70, in the middle portion of the channel 70, is 4.5 um and the length of the channel 70, in the two ends of the channel 70, is greater than 2.5 um but smaller than 4.5 um.

The above illustrates the preferred embodiments according to the present invention. However, it is noted that those skilled in the art would appreciate that various improvements and modifications are still available without departing from the scope of the present invention and such improvements and modifications are considered within the scope of protection of the present invention.

What is claimed is:

1. A thin-film transistor, comprising a gate terminal, a source terminal, and a drain terminal, the source terminal and the drain terminal being arranged in a side-by-side manner above the gate terminal, the source terminal comprising a first edge, the drain terminal comprising a second edge, the first edge and the second edge facing each other, the first edge and the second edge forming therebetween a channel, wherein the first edge and the second edge are both in a nonlinear form, and wherein with a dimension of the channel extending in an extension direction of the first edge and the second edge being a width of the channel that is defined between the first edge and the second edge spaced from each other in a lengthwise direction of the channel that is substantially perpendicular to the widthwise direction, the channel is narrowed from a middle thereof toward two ends in the widthwise direction of the channel, wherein the channel extends linearly in the widthwise direction and the first edge and the second edge are respectively location on opposite sides of the channel and extending between two opposite ends of the channel and defining an opening between the first and second edges at each of the two ends of the channel where the two openings are opposite to and spaced from each other in the widthwise direction and the width of the channel in the openings is reduced with respect to the width of the channel in the middle thereof, the openings being adapted to expose the two ends of the channel to receive external optical energy for exposure such that the optical energy received at the two ends of the channel corresponds to the optical energy received at the middle of the channel.

2. The thin-film transistor as claimed in claim 1, wherein the first edge comprises a first segment, a second segment, and a third segment that are connected in sequence, the first segment and the third segment being arranged in a symmetric manner at opposite ends of the second segment, the first segment comprising a connection end connected to the second segment and a free end distant from the second segment, the first segment being arranged to get closer to the second edge in a direction from the connection end to the free end.

3. The thin-film transistor as claimed in claim 2, wherein the second edge and the first edge are of the same configuration.

4. The thin-film transistor as claimed in claim 3, wherein the second segment is linear.

5. The thin-film transistor as claimed in claim 3, wherein the first segment and the third segment are both in a linear form and an included angle between the first segment and the second segment and an included angle between the third segment and the second segment are obtuse angles.

6. The thin-film transistor as claimed in claim 3, wherein the first segment and the third segment are both in a curved form and smooth transitions are respectively formed between the first segment and the second segment and between the third segment and the second segment.

7. The thin-film transistor as claimed in claim 1, wherein a channel length in the middle of the channel is 4.5 um and a channel length at the ends of the channel is greater than 2.5 um and smaller than 4.5 um.

8. A thin-film transistor, comprising a gate terminal, a source terminal, and a drain terminal, the source terminal and the drain terminal being arranged in a side-by-side manner above the gate terminal, the source terminal comprising a first edge, the drain terminal comprising a second edge, the first edge and the second edge facing each other, the first edge and the second edge forming therebetween a channel, wherein the first edge and the second edge are both in a nonlinear form, and wherein with a dimension of the channel extending in an extension direction of the first edge and the second edge being a width of the channel that is defined between the first edge and the second edge spaced from each other in a lengthwise direction of the channel that is substantially perpendicular to the widthwise direction, the channel is narrowed from a middle thereof toward two ends in the widthwise direction of the channel, wherein the channel extends linearly in the widthwise direction and the first edge and the second edge are respectively location on opposite sides of the channel and extending between two opposite ends of the channel and defining an opening between the first and second edges at each of the two ends of the channel where the two openings are opposite to and spaced from each other in the widthwise direction and the width of the channel in the openings is reduced with respect to the width of the channel in the middle thereof, the openings being adapted to expose the two ends of the channel to receive external optical energy for exposure such that the optical energy received at the two ends of the channel corresponds to the optical energy received at the middle of the channel;

the first edge comprises a first segment, a second segment, and a third segment that are connected in sequence, the first segment and the third segment being arranged in a symmetric manner at opposite ends of the second segment, the first segment comprising a connection end connected to the second segment and a free end distant from the second segment, the first segment being arranged to get closer to the second edge in a direction from the connection end to the free end; and a channel length in the middle of the channel is 4.5 um and a channel length at the ends of the channel is greater than 2.5 um and smaller than 4.5 um.

9. The thin-film transistor as claimed in claim 8, wherein the second edge and the first edge are of the same configuration.

10. The thin-film transistor as claimed in claim 9, wherein the second segment is linear.

11. The thin-film transistor as claimed in claim 9, wherein the first segment and the third segment are both in a linear form and an included angle between the first segment and the second segment and an included angle between the third segment and the second segment are obtuse angles.

12. The thin-film transistor as claimed in claim 9, wherein the first segment and the third segment are both in a curved form and smooth transitions are respectively formed between the first segment and the second segment and between the third segment and the second segment.

* * * * *